United States Patent
Stender

(10) Patent No.: US 6,570,793 B2
(45) Date of Patent: May 27, 2003

(54) SEMICONDUCTOR MEMORY HAVING A REDUNDANCY CIRCUIT FOR WORD LINES AND METHOD FOR OPERATING THE MEMORY

(75) Inventor: Jörg Stender, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/925,168

(22) Filed: Aug. 8, 2001

(65) Prior Publication Data

US 2002/0021604 A1 Feb. 21, 2002

(30) Foreign Application Priority Data

Aug. 8, 2000 (DE) .......................................... 100 38 664

(51) Int. Cl.[7] .................................................. G11C 7/00
(52) U.S. Cl. .............. 365/200; 365/230.01; 365/230.06
(58) Field of Search ...................... 365/230.01, 230.03, 365/200, 201

(56) References Cited

U.S. PATENT DOCUMENTS

| | | | | |
|---|---|---|---|---|
| 5,544,106 A | * | 8/1996 | Koike | 365/200 |
| 5,555,212 A | * | 9/1996 | Toshiaki et al. | 365/200 |
| 5,894,441 A | | 4/1999 | Nakazawa | |
| 5,920,515 A | * | 7/1999 | Shaik et al. | 365/200 |
| 6,055,196 A | * | 4/2000 | Takai | 365/200 |
| 6,084,807 A | * | 7/2000 | Choi | 365/200 |
| 6,349,064 B1 | * | 2/2002 | Nakaoka | 365/200 |
| 2002/0075733 A1 | * | 6/2002 | Zheng et al. | 365/200 |

* cited by examiner

*Primary Examiner*—Viet Q. Nguyen
(74) *Attorney, Agent, or Firm*—Laurence A. Greenberg; Werner H. Stemer; Ralph E. Locher

(57) ABSTRACT

A redundancy circuit for a semiconductor memory having word lines and redundant word lines is described. The redundancy circuit activates the word line at the same time as checking to determine whether the applied address per word line is the address of a defective word line, and deactivates the word line again if it is determined that the applied address is the address of a defective word line.

5 Claims, 3 Drawing Sheets

SEMICONDUCTOR MEMORY HAVING A REDUNDANCY CIRCUIT FOR WORD LINES AND METHOD FOR OPERATING THE MEMORY

BACKGROUND OF THE INVENTION

Field of the Invention

The invention relates to a redundancy circuit for a semiconductor memory which has a memory cell matrix whose memory cells are selected by word lines and bit lines, the word lines contain redundant word lines which are activated when a word line is defective, and a method for activating word lines with such a redundancy circuit.

Semiconductor memories in which data can be stored after an address has been preset and read out again at the address are generally organized in blocks. Here, each memory block has a number of memory cells which can be selected by word lines and bit lines. In the case of dynamic memories with random access (DRAMs), 1-transistor memory cells are usually used in which a memory capacitor is connected to a bit line via a selector transistor. The selector transistor is also connected to a word line via a control terminal. The word lines and bit lines are disposed in the form of a matrix, the memory cells being located at the points of intersection. Each memory block is bounded on two opposite sides by sense amplifiers.

The DRAMs are driven in such a way that only one word line per memory block is selected at a given time because otherwise a plurality of memories would be connected simultaneously to the same bit line.

In order to repair faulty memory cells in such semiconductor memories, the word lines with the defective memory cells are replaced by redundant word lines with intact memory cells which are connected to the same bit lines. Here, the procedure is generally such that, when a line address for addressing a defective word line is applied, the word line that is redundant with respect thereto is selected and the defective word line is prevented from being activated. During the redundancy programming, two methods are customary here. In what is referred to as intra-block redundancy, a defective word line is replaced by a word line, which is redundant with respect thereto and is provided in the same memory block.

This ensures that, even when a defective word line is replaced, there is always at most one word line active within a memory cell block. However, a disadvantage with intra-block redundancy is that it is necessary to provide a very large number of redundant word lines, and thus memory cells per block. For this reason, instead of intra-block redundancy, inter-block redundancy methods are also used in which a defective word line in a memory block is replaced by a redundant word line in another memory block.

In the known redundancy circuits, the redundancy programming is carried out in such a way that, if an address signal with a line address is applied to the DRAM, the address is tested by a comparator device in the redundancy circuit in order to determine whether the applied line address is the address of a defective word line. This can occur, for example, in such a way that the output signals of fuse sets are evaluated in the DRAM which, when there is a defective word line in a memory block, makes it possible to activate a word line which is redundant with respect thereto in the same memory block, or in another memory block. If the evaluation of the fuse sets indicates correspondence between the applied line address and a fused line address, the comparator device of the redundancy circuit then generates an activation signal that activates the associated redundant word line via a respective driver. If the comparator device of the redundancy circuit determines that the applied line address is, however, not a fused line address, an activation signal is output to an address decoding device in the redundancy circuit, which decodes the applied line address and then activates the associated word line by the respective driver.

U.S. Pat. No. 5,894,441 discloses a redundancy circuit for a semiconductor memory. In this redundancy circuit, an address signal with a line address is applied in parallel to a comparator device of the redundancy circuit and to the address-decoding device. If the evaluation of a fuse set of the comparator device reveals that there is a correspondence between the applied line address and a fused line address, an activation signal for a respective driver of the associated redundant word line is generated by the comparator device of the redundancy circuit. At the same time, the comparator device of the redundancy circuit outputs a deactivation signal to an address-decoding device in order to prevent the latter from activating the defective word line by a respective driver.

The known redundancy circuits provide a chronological sequence for the activation of word lines. When a line address signal is applied, a comparator device of the redundancy circuit tests whether the address is that of a defective word line. This requires a certain testing period. If a defective word line is detected, the word line, which is redundant with respect thereto is subsequently activated with an activation signal, which then changes from a low level to a relatively high level. If, on the other hand, the comparator device of the redundancy circuit determines that the applied address characterizes an intact word line, an activation signal is output to the address decoding circuit, when then activates the respective word line after a delay time. The word line is then switched from the low level to the high level.

A disadvantage with the conventional word line activation method is that when an intact word line is activated it is necessary to wait for the redundancy evaluation, which leads to an undesired loss of access time to the intact word line.

SUMMARY OF THE INVENTION

It is accordingly an object of the invention to provide a semiconductor memory having a redundancy circuit for word lines and a method for operating the memory that overcome the above-mentioned disadvantages of the prior art methods and devices of this general type, which are distinguished by reliable redundancy testing accompanied by rapid access to the word line to be activated.

With the foregoing and other objects in view there is provided, in accordance with the invention, a redundancy circuit for a semiconductor memory having a memory cell matrix with memory cells, word lines and bit lines for selecting the memory cells. The word lines include redundant word lines activated when one of the word lines is defective. The redundancy circuit contains an address decoding device for decoding an applied address for a word line and activating the word line associated with the applied address. A redundancy comparator device is provided for testing the applied address for the word line to determine whether the word line has an address of a defective word line. After the applied address has been determined as being the address of the defective word line, the redundancy comparator device activates a respective redundant word line. The redundancy comparator device has an output device connected to the address decoding device and the output device outputs a deactivation signal after the applied address for the word line has been determined as being the address of the defective word line. The address decoding device and the redundancy comparator device are configured such that the address decoding device decodes the applied address for the word line in a chronologically parallel fashion and activates the word line associated with the applied address. The redundancy comparator device tests the applied address for the word line to determine whether the word line is the defective word line. The address decoding device has a deactivation device for deactivating the word line being an activated defective word line after a reception of the deactivation signal from the redundancy comparator device.

The redundancy testing according to the invention is distinguished by the fact that a redundancy comparator device is used to test an applied address for a word line to determine whether it is the address of a defective word line, and at the same time an address decoding device activates the respective word line. If it is determined during the checking of the applied address that a word line is defective, the respective redundant word line is then activated and the defective word line is deactivated again. This word line activation method has the advantage of faster access to an intact word line because it is not necessary to wait for the redundancy evaluation in order to activate an intact word line.

The word line redundancy method according to the invention is embodied as inter-block redundancy in the semiconductor memory, in which case either the redundant word lines are combined in a separate block or word lines and redundant word lines are contained in common blocks. An associated redundant word line in another block is activated when there is a defective word line in a block. This procedure reliably prevents a plurality of word lines in the same block from being activated at the same time.

In accordance with an added feature of the invention, after the decoding of the word line selected by the applied address, the address-decoding device activates the word line with an activation signal sent to an associated word line driver of the semiconductor memory.

In accordance with an additional feature of the invention, the redundancy comparator device checks the applied address to determine whether there is correspondence with a fused address, which indicates the word is defective. And when there is correspondence activates the respective redundant word line with an activation signal to an associated redundant word line driver of the semiconductor memory.

With the foregoing and other objects in view there is further provided, in accordance with the invention, a semiconductor memory having a memory cell matrix with memory cells, word lines and bit lines connected to the memory cells for selecting the memory cells, and redundant word lines crossing the bit lines and activated when one of the word lines is defective. The redundant word lines are combined in a separate block separated from the word lines. A redundancy circuit is provided and includes an address decoding device for decoding an applied address for a word line and activating the word line, and a redundancy comparator device for testing the applied address for the word line to determine whether the word line has an address of a defective word line. After the applied address has been determined as being the address of the defective word line, the redundancy comparator device activates a respective redundant word line. The redundancy comparator device has an output device connected to the address decoding device. The output device outputs a deactivation signal after the applied address for the word line has been determined as being the address of the defective word line. The address decoding device and the redundancy comparator device are configured such that the address decoding device decodes the applied address for the word line in a chronologically parallel fashion and activates the word line of the applied address. The redundancy comparator device tests the applied address for the word line to determine whether the word line is defective. The address decoding device has a deactivation device for deactivating the word line being an activated defective word line after a reception of the deactivation signal from the redundancy comparator device.

In accordance with a further feature of the invention, the word lines and the redundant word lines are combined in common blocks including a first block and a second block, an associated redundant word line in the first block being activated for a defective word line in the second block.

With the foregoing and other objects in view there is provided, in accordance with the invention, a method for activating word lines in a memory having a memory cell matrix with memory cells selected by the word lines and the bit lines. The word lines include redundant word lines which are activated when one of the word lines is defective. The method includes the steps of chronologically parallel decoding of an applied address for a word line; activating the word line and checking whether the applied address for the word line is an address of a defective word line; activating a redundant word line after the applied address is determined as being the address of the defective word line; and de-activating the word line found to be defective after activating the redundant word line.

In accordance with an added mode of the invention, after the decoding of the applied address, the word line is activated with an activation signal sent to an associated word line driver of the memory.

In accordance with another mode of the invention, there is the step of determining if the applied address corresponds to a fused address, which indicates a defective word line, and when there is correspondence the redundant word line is activated by an activation signal sent to an associated redundant word line driver of the memory.

Other features which are considered as characteristic for the invention are set forth in the appended claims.

Although the invention is illustrated and described herein as embodied in a semiconductor memory having a redundancy circuit for word lines and a method for operating the memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
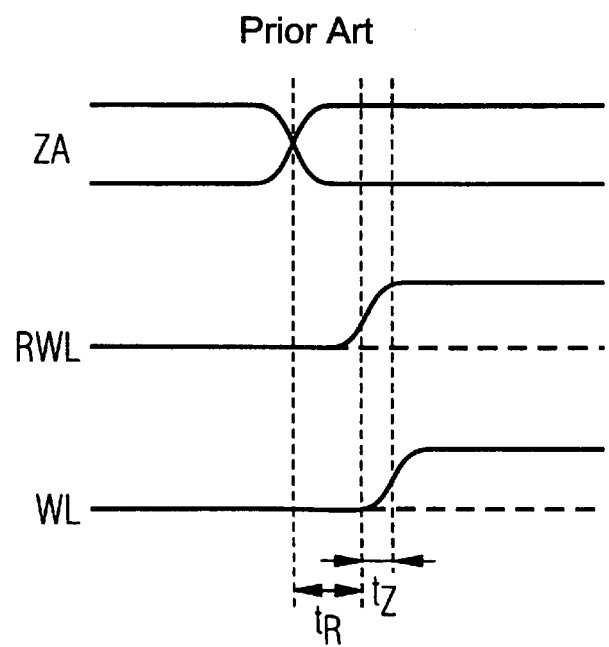
FIG. 4 is a timing diagram of the chronological sequence during a word line activation operation with a conventional redundancy circuit.

In all the figures of the drawing, sub-features and integral parts that correspond to one another bear the same reference symbol in each case. Referring now to the figures of the drawing in detail and first, particularly, to FIG. 4 thereof, there is shown a timing diagram of known redundancy circuits in which a chronological sequence for the activation of word lines is shown. When a line address signal ZA is applied, a comparator device of a redundancy circuit tests whether the address is that of a defective word line. A testing period of $t_R$ is shown. If a defective word line is detected, the word line, which is redundant with respect thereto is subsequently activated with an activation signal, which then changes from a low level to a relatively high level. The activated redundant word line RWL is illustrated in FIG. 4 as an unbroken line. If, on the other hand, the comparator device of the redundancy circuit determines that the applied address characterizes an intact word line, an activation signal is output to the address decoding circuit, which then activates the respective word line WL after a delay time $t_Z$. The word line is then switched from the low level to the high level, as is illustrated by an unbroken line in FIG. 4. A disadvantage with the conventional word line activation method is that when an intact word line is activated it is necessary to wait for the redundancy evaluation, which leads to an undesired loss of access time to the intact word line.

Figure 1:
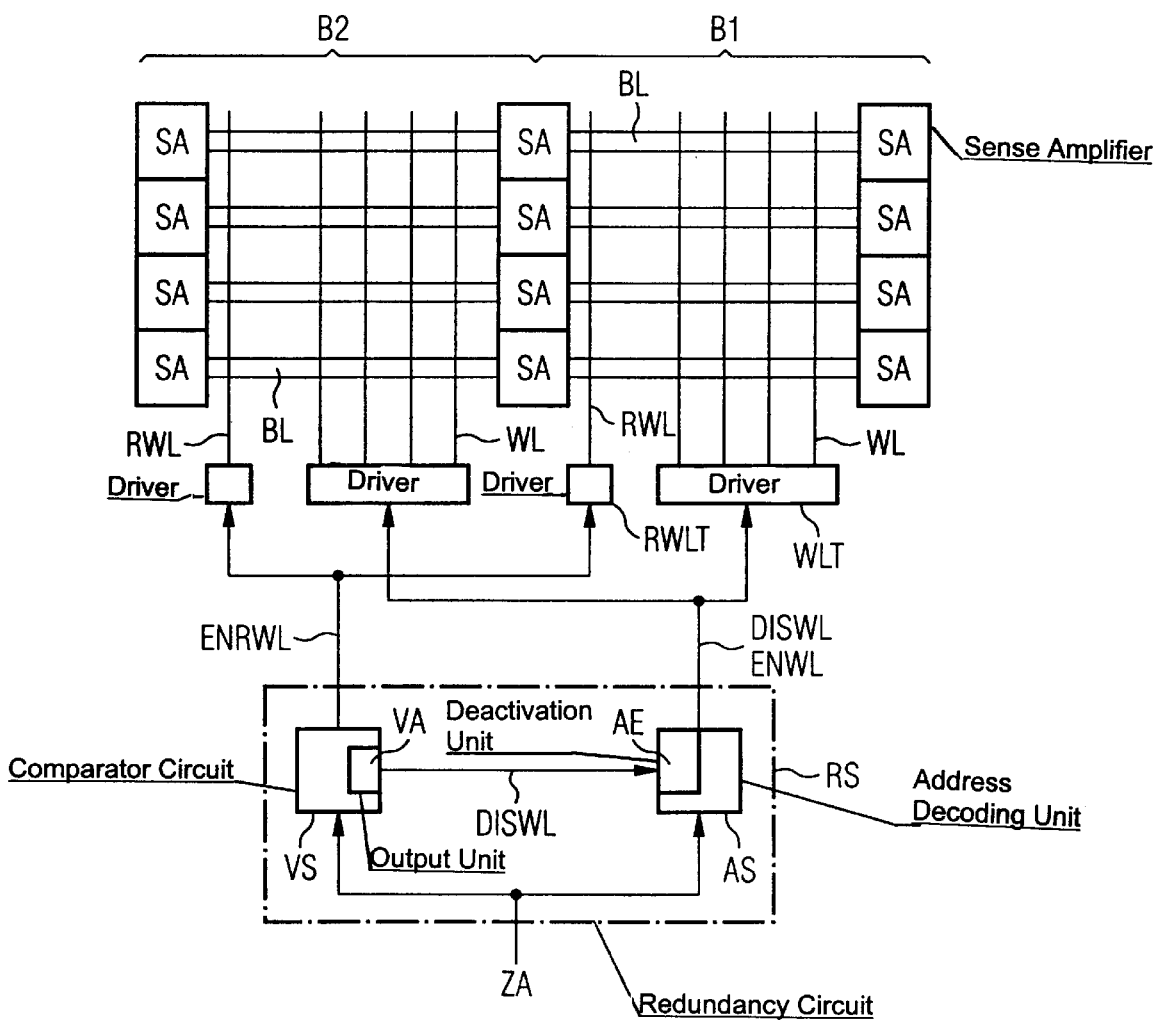
FIG. 1 is a block diagram of a first embodiment of a DRAM with a redundancy circuit according to the invention.

In FIG. 1, there is shown a dynamic semiconductor memory with random access (DRAM) according to the invention. The DRAM is made up from two blocks B1, B2 in the form of a matrix, each block having four word lines WL and one redundant word line RWL in one direction, and four bit lines BL in a direction perpendicular thereto. In each case memory cells MC (only a few memories cells being shown for clarity) of the DRAM are disposed at the intersection points of the word lines WL, or of the redundant word line RWL, with the bit lines BL. The memory cells MC each have a storage capacitor which is connected to a respective bit line BL via a selector transistor. A gate of the selector transistor being connected to an associated word line WL.

The DRAM also has sense amplifiers SA, which are connected to the bit lines BL and are disposed on both sides of each of the memory blocks B1, B2. The illustrated memory architecture corresponds here to what is referred to as the folded bit line concept. The sense amplifiers SA amplify an item of information which is applied to the respective bit line BL by one of the memory cells MC, and pass on the information, if appropriate, to external data lines of the DRAM. Each of the blocks B1, B2 also has a word line driver WLT to which the word lines WL are connected, and a redundant word line driver RWLT, which is connected to the redundant word line RWL.

The word line driver WLT and the redundant word line driver RWLT are each addressed by a redundancy circuit RS which contains a comparator unit VS and an address decoding unit AS. The line address signals ZA which select the addresses of the word lines for a write or read operation in the DRAM are present at an input of the redundancy circuit RS. The line address signals ZA are sent in parallel in the redundancy circuit RS to the redundancy comparator unit VS and to the address decoding unit AS. In the redundancy comparator unit VS it is tested whether the word line selected by the applied line address ZA is a defective word line. This can be carried out, for example, in such a way that the comparator unit VS evaluates whether the applied line address ZA corresponds to a fused address. The fused addresses correspond, for example, to the output signals of fuse sets which are assigned to the redundant word lines RWL in the DRAM. The fuse sets are electrical connections, which are activated if memory cells in the DRAM are defective.

If a redundancy comparator unit VS determines that the applied line address ZA corresponds to one of the fused addresses, which indicates that there is a defective word line, the redundancy comparator unit VS activates the respective redundant word line RWL with an activation signal ENRWL to the associated driver RWLT. The redundant word line RWL is always located, in the embodiment of the DRAM shown in FIG. 1, in a block, which does not contain the word line WL addressed by the line address ZA.

At the same time as the redundancy evaluation in the redundancy comparator unit VS, the decoding of the word line selected by the line address ZA takes place in the address decoding unit AS. The word line WL is then activated by the address-decoding unit with an activation signal ENWL to the associated word line driver WLT. The evaluation of the line addresses ZA by the redundancy comparator unit VS, and the activation of a redundant word line if the applied line address corresponds to a fused address, takes place chronologically in parallel with the decoding of the applied line address and activation of the corresponding word line WL by the address decoding unit AS. In the event of the redundancy comparator unit VS determining that the applied line address ZA is an address of a defective word line, a deactivation signal DISWL is output by an output unit VA to the address decoding unit AS at the same time as the activation of the respective redundant word line RWL by the redundancy comparator unit VS. When such a deactivation signal DISWL is received, a deactivation unit AE of the address-decoding unit AS then deactivates the already activated word line, which has been found to be defective.

Figure 3:
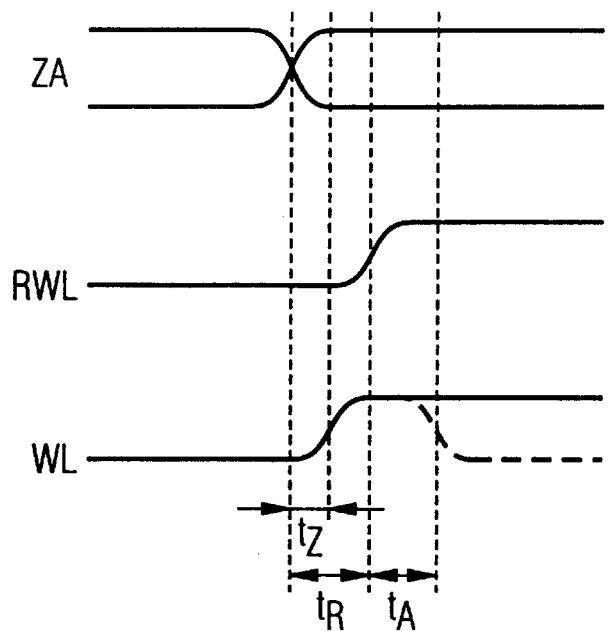
FIG. 3 is a timing diagram showing a chronological sequence of a word line activation operation with the redundancy circuit.

The time sequences for the word line activation operation by the redundancy circuit RS are shown in FIG. 3. If the address signal ZA is applied to the redundancy circuit RS, the redundancy comparator unit VS requires the test time $t_R$ in order to compare the applied line address ZA with the fused addresses, and if appropriate to activate the respective redundant word line RWL with the activation signal ENRWL to the redundant word line driver RWLT if the applied line address ZA is found to be an address of a defective word line. The respective redundant word line RWL is then switched from a low level to a high level, as indicated by an unbroken line in FIG. 3.

In the event of the redundancy comparator unit VS not determining any fused address, the redundant word line RWL remains at its low level, which is indicated in FIG. 3 by a broken line. At the same time as the testing by the redundancy comparator unit VS, the address decoding is carried out by the address decoding unit AS, and a respective activation signal ENWL is output to the word line driver WLT so that the latter activates the respective word line WL. The word line WL is then switched from its low level to its high level, as indicated in FIG. 3 by an unbroken line.

The time period until the respective word line WL is activated corresponds here to $t_Z$.

In the event of the redundancy comparator unit VS not determining any fused address, the activated word line WL remains at its high level in order to carry out a write or read operation in the associated memory cell. If, on the other hand, the redundancy comparator unit VS determines a defective word line, the deactivation signal DISWL is output to the address decoding unit AS in parallel with the activation of the respective redundant word line with the activation signal ENRWL. The address-decoding unit AS applies the deactivation signal DISWL with a certain time delay $t_A$ to the respective word line driver WLT, which deactivates the defective word line again. The defective word line WL is then switched again from the high level to the low level, which is illustrated in FIG. 3 by a broken line.

The inventive parallel activation of word lines and of redundant word lines with subsequent deactivation of the associated defective word lines significantly shortens the access time to the word lines if they are intact. At the same time, redundancy programming, in which the word line and the word line, which is redundant with respect thereto are located in different blocks, ensures that only one word line is active per block. In the embodiment shown in FIG. 1, the word lines and the word lines, which are redundant with respect thereto are combined in common blocks.

Figure 2:
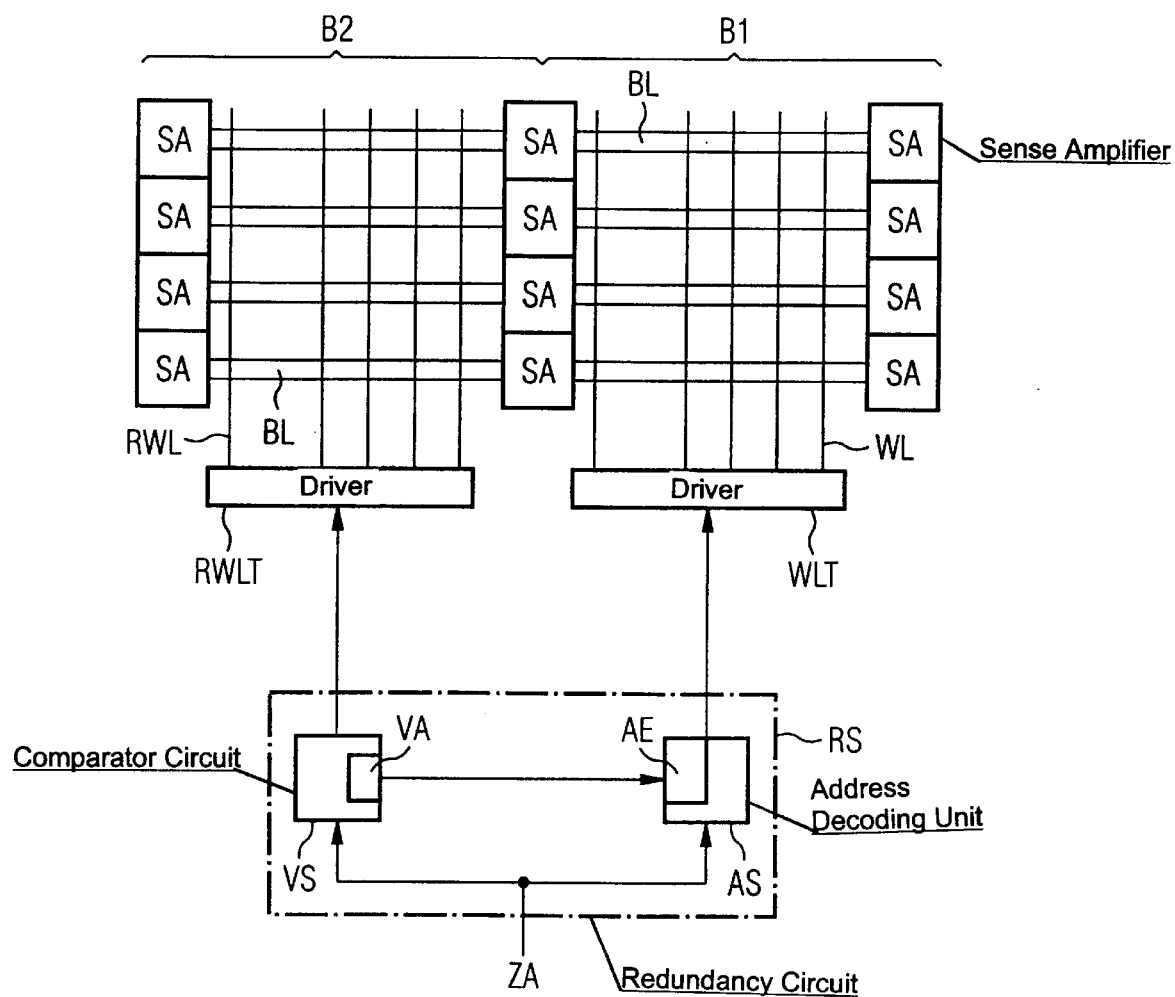
FIG. 2 is a block diagram of a second embodiment of the DRAM with the redundancy circuit.

FIG. 2 shows a further embodiment in which the word lines WL and the redundant word lines RWL are each organized into separate blocks. This configuration permits a saving in terms of lines and drivers because respective redundant word line drivers RWLT, which are connected to the redundancy comparator unit VS of the redundancy circuit RS, only have to be provided in the blocks with the redundant word lines RWL. The redundancy circuit RS in the embodiment shown in FIG. 2 corresponds here to the redundancy circuit shown in FIG. 1.

In the embodiments of the DRAM shown in FIGS. 1 and 2, only two blocks with word lines WL, redundant word lines RWL and the bit lines BL, disposed in a matrix form, are ever illustrated. The DRAM memory has, of course, a significantly larger number of word lines WL, bit lines BL and blocks B1, B2. The features of the invention which are disclosed in the present description, drawings and claims can be significant for the implementation of the invention in its various embodiments, both individually and in any desired combination.

I claim:

1. A redundancy circuit for a semiconductor memory having a memory cell matrix with memory cells, word lines and bit lines for selecting the memory cells, the word lines include redundant word lines activated when one of the word lines is defective, the redundancy circuit comprising:
    an address decoding device for decoding an applied address for a word line and activating the word line associated with the applied address; and
    a redundancy comparator device for testing the applied address for the word line to determine whether the word line has an address of a defective word line, and, after the applied address has been determined as being the address of the defective word line, said redundancy comparator device activates a respective redundant word line, said redundancy comparator device having an output device connected to said address decoding device and said output device outputting a deactivation signal after the applied address for the word line has been determined as being the address of the defective word line;
    said address decoding device and said redundancy comparator device are configured such that said address decoding device decodes the applied address for the word line in a chronologically parallel fashion and activates the word line associated with the applied address, and said redundancy comparator device tests the applied address for the word line to determine whether the word line is the defective word line, said address decoding device having a deactivation device for deactivating the word line being an activated defective word line after a reception of the deactivation signal from said redundancy comparator device.

2. The redundancy circuit according to claim 1, wherein after a decoding of the word line selected by the applied address, said address-decoding device activates the word line with an activation signal sent to an associated word line driver of the semiconductor memory.

3. The redundancy circuit according to claim 1, wherein said redundancy comparator device checks the applied address to determine whether there is correspondence with a fused address, which indicates the word is defective, and when there is correspondence activates the respective redundant word line with an activation signal to an associated redundant word line driver of the semiconductor memory.

4. A semiconductor memory, comprising:
    a memory cell matrix with memory cells;
    word lines and bit lines connected to said memory cells for selecting said memory cells;
    redundant word lines crossing said bit lines and activated when one of said word lines is defective, said redundant word lines being combined in a separate block separated from said word lines;
    a redundancy circuit, including:
        an address decoding device for decoding an applied address for a word line and activating the word line; and
        a redundancy comparator device for testing the applied address for the word line to determine whether the word line has an address of a defective word line, and, after the applied address has been determined as being the address of the defective word line, said redundancy comparator device activates a respective redundant word line, said redundancy comparator device having an output device connected to said address decoding device, said output device outputting a deactivation signal after the applied address for the word line has been determined as being the address of the defective word line;
        said address decoding device and said redundancy comparator device are configured such that said address decoding device decodes the applied address for the word line in a chronologically parallel fashion and activates the word line of the applied address, and said redundancy comparator device tests the applied address for the word line to determine whether the word line is defective, said address decoding device having a deactivation device for deactivating the word line being an activated defective word line after a reception of the deactivation signal from said redundancy comparator device.

5. The semiconductor memory according to claim 4, wherein said word lines and said redundant word lines are combined in common blocks including a first block and a second block, an associated redundant word line in said first block being activated for a defective word line in said second block.

* * * * *